(12) United States Patent
Nolan et al.

(10) Patent No.: US 7,780,821 B2
(45) Date of Patent: Aug. 24, 2010

(54) MULTI-CHAMBER PROCESSING WITH SIMULTANEOUS WORKPIECE TRANSPORT AND GAS DELIVERY

(75) Inventors: Thomas Patrick Nolan, Fremont, CA (US); Jeffrey Shane Reiter, Palo Alto, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 464 days.

(21) Appl. No.: 10/902,960

(22) Filed: Aug. 2, 2004

(65) Prior Publication Data

US 2006/0021576 A1    Feb. 2, 2006

(51) Int. Cl.
C23C 14/00 (2006.01)
C23C 16/00 (2006.01)

(52) U.S. Cl. .............. 204/192.26; 204/192.1; 204/298.23; 204/298.25; 427/127; 427/162; 427/255.5; 118/719

(58) Field of Classification Search .......... 118/719; 414/939; 204/298.23, 298.25
See application file for complete search history.

(56) References Cited

U.S. PATENT DOCUMENTS

| | | | |
|---|---|---|---|
| 4,824,545 A | 4/1989 | Arnold et al. | |
| 4,911,810 A | 3/1990 | Lauro et al. | |
| 5,016,562 A * | 5/1991 | Madan et al. | 118/719 |
| 5,364,219 A | 11/1994 | Takahashi et al. | |
| 5,683,561 A * | 11/1997 | Hollars et al. | 204/298.25 |
| 5,814,196 A * | 9/1998 | Hollars et al. | 204/298.15 |
| 5,873,942 A | 2/1999 | Park et al. | |
| 5,879,461 A | 3/1999 | Adams | |
| 5,895,712 A | 4/1999 | Chen et al. | |
| 5,913,978 A | 6/1999 | Kato et al. | |
| 5,954,927 A | 9/1999 | Kobayashi et al. | |
| 5,972,184 A * | 10/1999 | Hollars et al. | 204/298.09 |
| 6,016,611 A * | 1/2000 | White et al. | 34/92 |
| 6,039,770 A | 3/2000 | Yang et al. | |
| 6,103,069 A | 8/2000 | Davenport | |
| 6,113,749 A | 9/2000 | Kok et al. | |
| 6,156,171 A * | 12/2000 | Hollars et al. | 204/298.25 |
| 6,286,230 B1 * | 9/2001 | White et al. | 34/403 |
| 6,497,799 B1 * | 12/2002 | McLeod | 204/192.2 |
| 6,571,729 B2 | 6/2003 | Sasaki et al. | |
| 2002/0020496 A1 | 2/2002 | Shinohara et al. | |
| 2002/0040846 A1 | 4/2002 | Schloremberg et al. | |

* cited by examiner

Primary Examiner—Karla Moore

(57) ABSTRACT

A method for treating/processing substrates/workpieces in a multi-chamber treatment/processing apparatus, comprising: providing a multi-chamber treatment/processing apparatus comprising at least a pair of operatively interconnected upstream and downstream treatment/processing chambers;
providing each of the chambers with at least one substrate/workpiece;
treating/processing the at least one substrate/workpiece positioned in each of the chambers;
evacuating process gas from each of the chambers during or upon completion of the treating/processing of the at least one substrate/workpiece positioned therein;
removing the at least one substrate/workpiece from the downstream treatment/processing chamber and initiating transport of the at least one substrate/workpiece from the upstream treatment/processing chamber to the downstream treatment/processing chamber, comprising initiating a flow of the process gas to the evacuated downstream treatment/processing chamber prior to completion of transport of the substrate/workpiece.

9 Claims, 6 Drawing Sheets

MULTI-CHAMBER PROCESSING WITH SIMULTANEOUS WORKPIECE TRANSPORT AND GAS DELIVERY

FIELD OF THE INVENTION

The present invention relates to improved methods and apparatus for treating workpieces transported through a continuously operating, in-line multi-chamber processing apparatus requiring rapid delivery of process and/or inert gas(es) to the chambers for achieving a desired rate of product throughput. The invention has particular utility in the automated manufacture of magnetic and magneto-optical (MO) recording media comprising a multi-layer stack of thin film layers formed on a suitable substrate, e.g., a disk-shaped substrate, by means of a physical vapor deposition (PVD) process such as cathode sputtering.

BACKGROUND OF THE INVENTION

Magnetic and MO media are widely employed in various applications, particularly in the computer industry for data/information storage and retrieval purposes. A magnetic medium in e.g., disk form, such as utilized in computer-related applications, comprises a non-magnetic substrate, e.g., of glass, ceramic, glass-ceramic composite, polymer, metal, or metal alloy, typically an aluminum (Al)-based alloy such as aluminum-magnesium (Al—Mg), having at least one major surface on which a layer stack comprising a plurality of thin film layers constituting the medium are sequentially deposited. Such layers may include, in sequence from the workpiece (substrate) deposition surface, a plating layer, e.g., of amorphous nickel-phosphorus (Ni—P), a polycrystalline underlayer, typically of chromium (Cr) or a Cr-based alloy such as chromium-vanadium (Cr—V), a magnetic layer, e.g., of a cobalt (Co)-based alloy, and a protective overcoat layer, typically of a carbon-based material having good mechanical (i.e., tribological) properties. A similar situation exists with MO media, wherein a layer stack is formed which comprises a reflective layer, typically of a metal or metal alloy, one or more rare-earth thermo-magnetic (RE-TM) alloy layers, one or more dielectric layers, and a protective overcoat layer, for functioning as reflective, transparent, writing, writing assist, and read-out layers, etc.

According to conventional manufacturing methodology, a majority of the above-described layers constituting magnetic and/or MO recording media are deposited by cathode sputtering, typically by means of multi-cathode and/or multi-chamber sputtering apparatus wherein a separate cathode comprising a selected target material is provided for deposition of each component layer of the stack and the sputtering conditions are optimized for the particular component layer to be deposited. Each cathode comprising a selected target material can be positioned within a separate, independent process chamber, in a respective process chamber located within a larger chamber, or in one of a plurality of separate, interconnected process chambers each dedicated for deposition of a particular layer. According to such conventional manufacturing technology, a plurality of media substrates, typically in disk form, are serially transported by means of a multi-apertured pallet or similar type holder, in linear or circular fashion, depending upon the physical configuration of the particular apparatus utilized, from one sputtering target and/or process chamber to another for sputter deposition of a selected layer thereon.

Referring now to FIGS. 1-2, shown therein, in simplified, schematic cross-sectional top and side views, respectively, is an illustrative, but not limitative, embodiment of a conventional in-line, multi-chamber "pass-by" apparatus for treating opposing surfaces of a plurality of vertically mounted workpieces/substrates, which apparatus can, if desired, form part of a larger, in-line apparatus for continuous, automated manufacture of, e.g., magnetic and/or magneto-optical (MO) recording media, such as hard disks, and wherein a plurality of workpieces/substrates (e.g. disks) are transported in a linear path transversely past a plurality of serially arranged chambers each forming a processing/treatment station for performing a processing/treatment of each of the plurality of substrates.

More specifically, apparatus 10, as illustrated, comprises a series of linearly elongated, vacuum chambers interconnected by a plurality of gate means G of conventional design (i.e., respective inlet and outlet gate means $G_{in}$ and $G_{out}$), the vacuum chambers forming a plurality of treatment chambers or stations, illustratively first and second treatment chambers or stations 1 and 1', each including at least one, preferably a pair of spaced-apart, oppositely facing, linearly elongated treatment sources 2, 2' (e.g., selected from among a variety of physical vapor deposition (PVD) sources, such as vacuum evaporation, sputtering, ion plating, etc. sources, and/or from among a variety of plasma treatment sources, such as sputter/ion etching, hydrogen, nitrogen, oxygen, argon, etc. plasma sources) for performing simultaneous treatment of both sides of dual-sided workpieces. Apparatus 10 further comprises a pair of buffer/isolation chambers such as 3, 3' and 3', 3" at opposite lateral ends of respective treatment chambers or stations 1 and 1' for insertion and withdrawal, respectively, of a plurality of vertically oriented workpieces/substrates, illustratively a plurality disk-shaped substrates 4 carried by a plurality of workpiece/substrate mounting/transport means 5, 5', e.g., perforated pallets adapted for mounting a plurality of disk-shaped substrates/workpieces, for "pass-by" transport through apparatus 10. Chambers 6, 6' respectively connected to the distal ends of inlet and outlet buffer/isolation chambers 3, 3" are provided for use of apparatus 10 as part of a larger, continuously operating, in-line apparatus wherein workpieces/substrates 4 receive processing/treatment antecedent and/or subsequent to processing in apparatus 10.

Apparatus 10 is, if required by the nature/mode of operation of treatment sources 2, 2', provided with conventional vacuum means (not shown in the drawing for illustrative simplicity) for maintaining the interior spaces of each of the treatment chambers 1, 1', etc. and buffer/isolation chambers 3, 3', 3", etc. at a reduced pressure below atmospheric pressure, and with means for supplying at least selected ones with an appropriate process gas (not shown in the drawing for illustrative simplicity). Apparatus 10 is further provided with a workpiece/substrate conveyor/transporter means of conventional design (not shown in the drawings for illustrative simplicity) for linearly transporting the workpiece/substrate mounting means 5, 5' through the respective gate means $G_{in}$ and $G_{out}$ from chamber-to-chamber in its travel through apparatus 10.

As indicated above, according to a preferred embodiment of the present invention of particular utility in the manufacture of disk-shaped magnetic and/or MO recording media, the workpieces/substrates 4, 4' carried by mounting means 5, 5' are in the form of annular disks, with inner and outer diameters corresponding to those of conventional hard disc-type magnetic and/or MO media, and each of the illustrated treatment chambers 1, 1' of apparatus 10 is provided with a pair of opposingly facing, linearly extending physical vapor deposition sources 2, typically elongated magnetron sputtering sources, for deposition of respective constituent thin films of the multi-layer magnetic or MO media on each surface of each of the plurality of disks 4, 4' carried by the perforated pallet-type mounting means 5, 5'.

Automated manufacture of magnetic recording media, e.g., hard disks, utilizing in-line or circular multi-chamber processing apparatus such as described supra, may require that one or more processing/treatment chambers, e.g., sputtering chambers, contain relatively high pressure sputtering gas atmospheres, for example, ~30 mTorr. In typical continuous manufacturing systems, such as described above, the sputtering gas(es) is (are) delivered, i.e., flowed, to the respective sputtering chamber before entry of the substrate(s)/workpiece(s) into the chamber, and removed, i.e., pumped out, from the chamber during sputtering and after completion of the sputtering process and withdrawal (exiting) of the substrate(s)/workpiece(s).

A typical sputtering cycle performed in apparatus 10 in the manufacture of multi-layer magnetic recording media comprises sequential steps of:

(1) sputter depositing a layer of a selected material on each of the substrates/workpieces 4, 4' in respective sputtering stations or chambers 1, 1', with inlet and outlet gas gates $G_{in}$ and $G_{out}$ of each sputtering chamber maintained in a closed position;

(2) evacuating sputter gas(es) from each sputtering station or chamber upon completion of sputter deposition therein;

(3) opening the inlet and outlet gas gates $G_{in}$ and $G_{out}$ of each sputtering chamber;

(4) transporting sputter-coated substrates/workpieces 4, 4', etc. from upstream sputter (or other type) treatment stations or chambers (e.g., 1) to the respective adjacent downstream sputter (or other type) treatment stations or chambers (e.g., 1');

(5) closing inlet and outlet gas gates $G_{in}$ and $G_{out}$ of each treatment station or chamber after entry of substrates/workpieces thereinto;

(6) supplying (i.e., flowing) process gas(es) to each sputtering station or chamber to achieve a desired pressure therein; and (7) repeating steps (1)-(6) as necessary.

However, in practice, the flow of sputtering gas(es) into the chamber during delivery, as in step (6), and the subsequent pump-out of the sputtering gas(es) in step (2), i.e., upon repetition of the cycle of steps (1)-(6), are both limited by the conductance of the system. As a consequence, an increased interval is frequently required between sputtering of workpiece(s)/substrates carried by successive pallets to the sputtering chamber in order to reach steady-state pressure in the chamber as the sputtering gas(es) is (are) supplied to the chamber. Thus, product throughput rates may be significantly limited by the intervals required for pump-out of a process chamber subsequent to completion of the treatment therein of the substrates/workpieces and prior to re-pressurization of the chamber preparatory to treatment therein of the next group of substrates/workpieces.

Accordingly, there exists a clear need for improved means and methodology for performing a plurality of treatments of substrates/workpieces in automated, continuously operating, multi-chamber, in-line apparatus, wherein substrates/workpieces are carried by a transport means serially through a plurality of treatment stations or chambers. Specifically, there exists a need for improved means and methodology for treating substrates/workpieces in a multi-chamber, in-line manufacturing apparatus at product throughput rates consistent with the requirements for economic competitiveness. More specifically, there exists a need for improved means and methodology for treating substrates/workpieces in a multi-chamber, in-line manufacturing apparatus which eliminates, or at least substantially mitigates, the above-described problems, disadvantages, and drawbacks associated with the conventional means and methodology for supplying and removing reaction gas(es) from treatment chambers during treatment cycles.

The present invention, therefore, addresses and eliminates, or at least substantially reduces the effects of the problems, drawbacks, and disadvantages on product throughput rates associated with the above-described conventional means and methodology for treating substrates/workpieces in in-line, multi-chamber processing apparatus, while maintaining full compatibility with all aspects of automated manufacturing technology, e.g., as utilized in the manufacture of hard disk recording media.

DISCLOSURE OF THE INVENTION

An advantage of the present invention is an improved method for treating/processing substrates/workpieces in a multi-chamber treatment/processing apparatus.

Another advantage of the present invention is an improved method for fabricating magnetic and/or magneto-optical (MO) recording media in a multi-chamber treatment/processing apparatus.

Yet another advantage of the present invention is an improved multi-chamber treatment/processing apparatus for treating/processing substrates/workpieces.

Still another advantage of the present invention is an improved multi-chamber treatment/processing apparatus useful in the fabrication of magnetic and/or magneto-optical (MO) recording media.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a method of treating/processing substrates/workpieces in a multi-chamber treatment/processing apparatus, comprising:

providing a multi-chamber treatment/processing apparatus comprising at least a pair of operatively interconnected upstream and downstream treatment/processing chambers;

providing each of the upstream and downstream treatment/processing chambers with at least one substrate/workpiece;

treating/processing the at least one substrate/workpiece positioned in each of the upstream and downstream treatment/processing chambers;

evacuating process gas from each of the upstream and downstream treatment/processing chambers during or upon completion of the treating/processing of the at least one substrate/workpiece positioned therein;

removing the at least one substrate/workpiece from the downstream treatment/processing chamber and initiating transport of the at least one substrate/workpiece from the upstream treatment/processing chamber to the downstream treatment/processing chamber, comprising initiating a flow of the process gas to the evacuated downstream treatment/processing chamber prior to completion of the transport.

According to the present invention, the method comprises steps of: initiating the flow of process gas to the downstream treatment/processing chamber when the at least one substrate/workpiece has completely exited the upstream treatment/processing chamber and is in a buffer/isolation chamber operatively connecting the upstream and downstream treatment/processing chambers; opening an inlet gate of the downstream treatment/processing chamber and closing an outlet gate of the upstream treatment/processing chamber upon exiting of the at least one substrate/workpiece from the upstream treatment/processing chamber or opening an inlet gate of the downstream treatment/processing chamber and reducing the gas conductance of an outlet gate of the upstream treatment/processing chamber upon exiting of the at least one substrate/workpiece from said upstream treatment/processing chamber, as by placing a movable shield placed adjacent the outlet gate of the upstream treatment/processing chamber.

In accordance with embodiments of the present invention, a multi-chamber treatment/processing apparatus is provided wherein at least each of the pair of upstream and downstream treatment/processing chambers is adapted to perform a physical vapor deposition (PVD) process selected from the group consisting of vacuum evaporation, sputtering, ion plating, ion beam deposition (IBD), and cathodic arc deposition (CAD), a chemical vapor deposition (CVD) process, or a plasma process selected from the group consisting of plasma-enhanced chemical vapor deposition (PECVD), plasma treatment, plasma etching, reactive plasma etching, and implantation.

According to preferred embodiments of the present invention, at least the downstream treatment/processing chamber is adapted to perform sputter deposition of a layer of a preselected material on at least one surface of the at least one substrate/workpiece, and the process gas comprises a preselected sputtering gas; the multi-chamber treatment/processing apparatus is adapted for deposition of a plurality of stacked layers on annular disk-shaped substrates/workpieces, e.g., sputter deposition of a plurality of stacked layers forming part of a disk-shaped magnetic or magneto-optical (MO) recording medium.

Another aspect of the present invention is an improved multi-chamber treatment/processing apparatus, comprising:

(a) a serially arranged plurality of treatment/processing chambers, each chamber including an inlet for insertion of substrates/workpieces into the chamber, an inlet gate means, an outlet for withdrawal of substrates/workpieces from the chamber, an outlet gate means, and means for supplying gas to the chamber and exhausting gas therefrom;

(b) buffer/isolation chambers operatively connecting each adjacent pair of treatment/processing chambers and including means for exhausting gas therefrom;

(c) means for transporting substrates/workpieces to and through each of the treatment/processing chambers for respective treatment/processing therein; and (d) means for controlling/regulating operation of the apparatus to provide the following operational sequence:

(1) performing a respective treatment/processing of at least one substrate/workpiece in each of the treatment/processing chambers, while each inlet gate and each outlet gate of each treatment/processing chamber is in a closed position and gas is exhausted from each buffer/isolation chamber and optionally from each treatment/processing chamber;

(2) opening each of the inlet and outlet gates of each of the treatment/processing chambers and transporting the at least one substrate/workpiece therein to the adjacent buffer/isolation chamber;

(3) closing the outlet gate of each of the treatment/processing chambers or reducing the gas conductance thereof, immediately after entry of the respective at least one substrate/workpiece into the adjacent buffer/isolation chamber during transport;

(4) transporting each of the substrates/workpieces through respective buffer/isolation chambers and initiating a flow of a respective gas to each treatment/processing chamber; and (5) closing the inlet gate of each treatment/processing chamber chamber immediately upon completion of entry of the at least one substrate/workpiece into the respective treatment/processing chamber.

According to embodiments of the present invention, each of the treatment/processing chambers is adapted to perform a physical vapor deposition (PVD) process selected from the group consisting of vacuum evaporation, sputtering, ion plating, ion beam deposition (IBD), and cathodic arc deposition (CAD), a chemical vapor deposition (CVD) process, or a plasma process selected from the group consisting of plasma-enhanced chemical vapor deposition (PECVD), plasma treatment, plasma etching, reactive plasma etching, and implantation.

Preferred embodiments of the present invention include those wherein a plurality of the treatment/processing chambers are adapted to perform sputter deposition of a plurality of stacked layers of a preselected material on at least one surface of each of the substrates/workpieces, e.g., sputter deposition of a plurality of stacked layers of a preselected material on a pair of opposing surfaces of disk-shaped substrates/workpieces, and wherein a plurality of the treatment/processing chambers are adapted to perform sputter deposition of a plurality of stacked layers forming part of a magnetic or magneto-optical (MO) recording medium.

According to embodiments of the present invention, the apparatus comprises means for reducing the gas conductance of the outlet gate of each of the treatment/processing chambers, e.g., a movable shield; the means for transporting substrates/workpieces to and through each of the treatment/processing chambers for respective treatment/processing therein comprises pallets adapted for mounting/carrying a plurality of disk-shaped substrates; the treatment/processing chambers are arranged in an in-line configuration; each of the treatment/processing chambers is adapted for performing treatment/processing of both major surfaces of dual-sided substrate/workpieces; and the means for controlling/regulating operation of the apparatus to provide the operational sequence comprises a programmed computer means.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and like reference numerals are employed throughout for designating similar features, wherein.

DESCRIPTION OF THE INVENTION

The present invention addresses and solves problems/drawbacks, etc. associated with conventional multi-chamber processing treatment apparatus utilized in the automated manufacture of a variety of products, including, but not limited to, magnetic and/or magneto-optical (MO) recording media comprising a stack of thin film layers formed over a suitable substrate, e.g., a disk-shaped substrate.

Specifically, the present invention addresses and ameliorates problems/drawbacks associated with the limitation of product throughput rates dictated by the extended intervals required for achieving steady-state process atmosphere conditions in each processing/treatment chamber upon transport of substrates/workpieces thereinto from a preceding (i.e., upstream) chamber. That is, in conventional multi-chamber apparatus, e.g., sputtering apparatus, the sputtering gas is flowed into the sputtering station or chamber prior to actually performing the sputtering and evacuated (i.e., pumped out) from the station or chamber at a relatively low rate during sputtering and at a relatively higher rate after completion of the sputtering process. The gas flow into the sputtering station or chamber and the subsequent pumping out of the sputtering station or chamber are limited by the conductance of the sputtering system(s), such that an increased interval between consecutive sputtering operations in the stations or chambers is required to reach a steady-state gas pressure as the required process pressure is increased, e.g., to ~30 mTorr for some sputtering processes associated with the manufacture of magnetic and/or magneto-optical (MO) recording media. Stated differently, product throughput rates utilizing conventional multi-chamber process/treatment apparatus and methodology typically are limited by the intervals required for evacuating processes gas(es) from the various process/treatment stations or chambers upon removal of treated/processed substrates/workpieces and re-filling of the process/treatment stations or chambers with fresh process gas(es) for processing/treatment of substrates/workpieces supplied to the station or chamber from the adjacent (upstream) station or chamber.

The present invention, therefore, is based upon recognition by the inventors that the above-described limitation on product throughput rates arising from the requirement for evacuating process gas(es) from and re-filling each processing/treatment station or chamber with fresh process gas(es) to achieve a desired steady-state atmosphere and pressure therein after transporting substrates/workpieces thereinto from a preceding processing/treatment station or chamber can be substantially avoided, or at least minimized, by initiating delivery (i.e., flow) of process gas(es) to the process/treatment stations or chambers prior to completion of transport of the substrates/workpieces from the preceding (i.e., upstream) process/treatment station or chamber and closure of the inlet and outlet gas gates.

Figure 1:
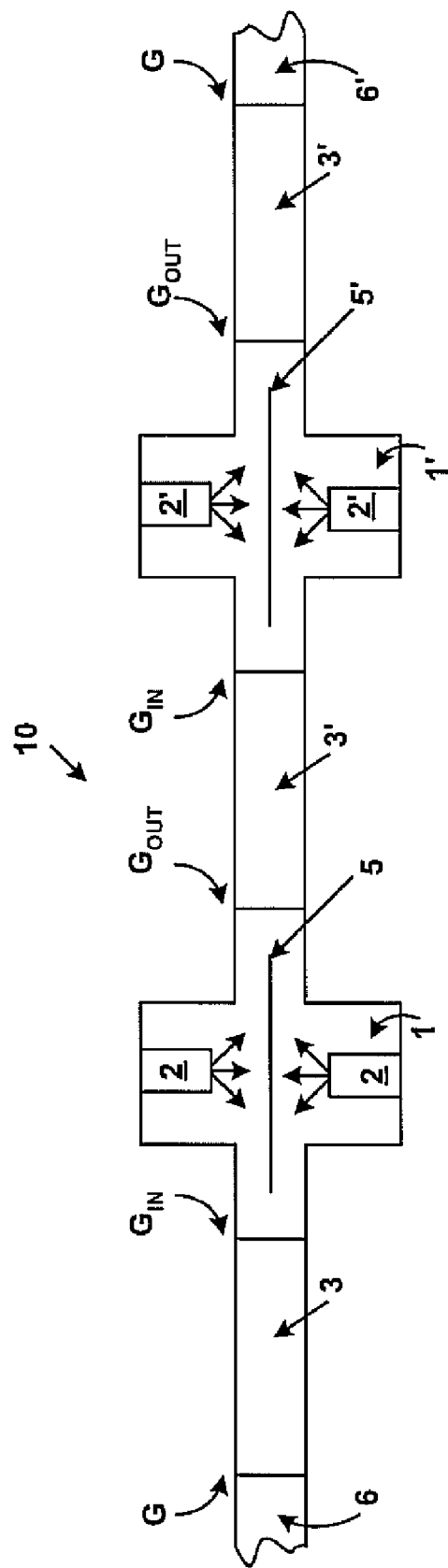
FIG. 1 is a simplified, schematic cross-sectional top view of a portion of a multi-chamber, in-line, "pass-by" processing/treatment apparatus according to the conventional art.
Figure 2:
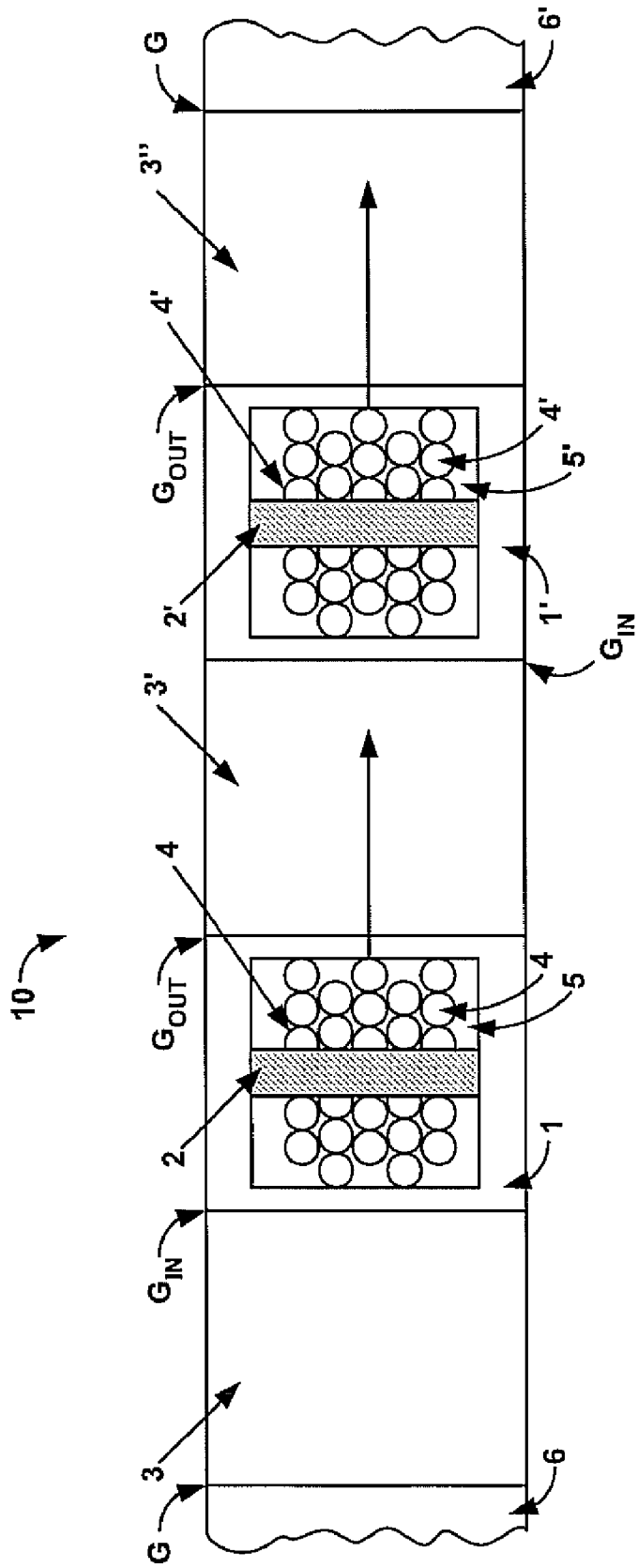
FIG. 2 is a simplified, schematic cross-sectional side view of the in-line apparatus of FIG. 1.
Figure 3:
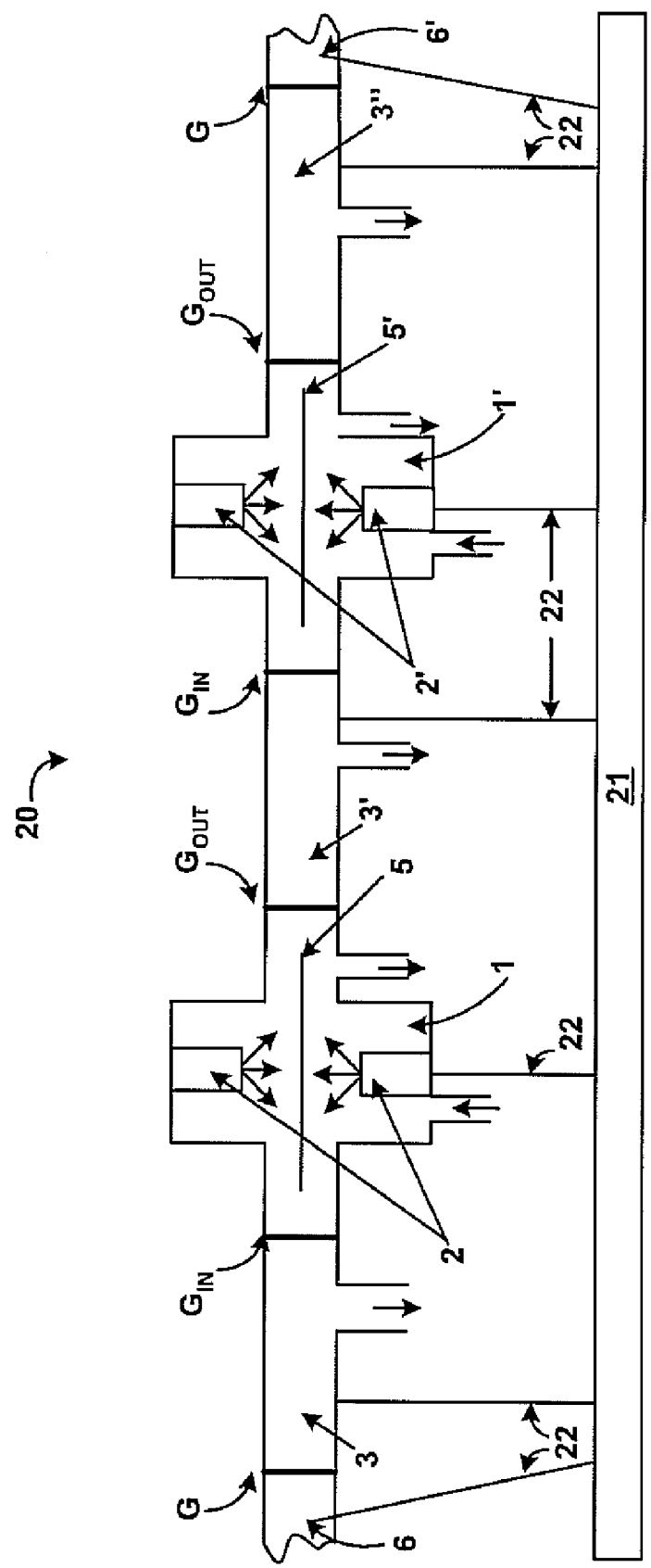
FIG. 3 is a simplified, schematic cross-sectional top view of a portion of a multi-chamber, in-line processing/treatment apparatus according to an embodiment of the present invention.
Figure 4:
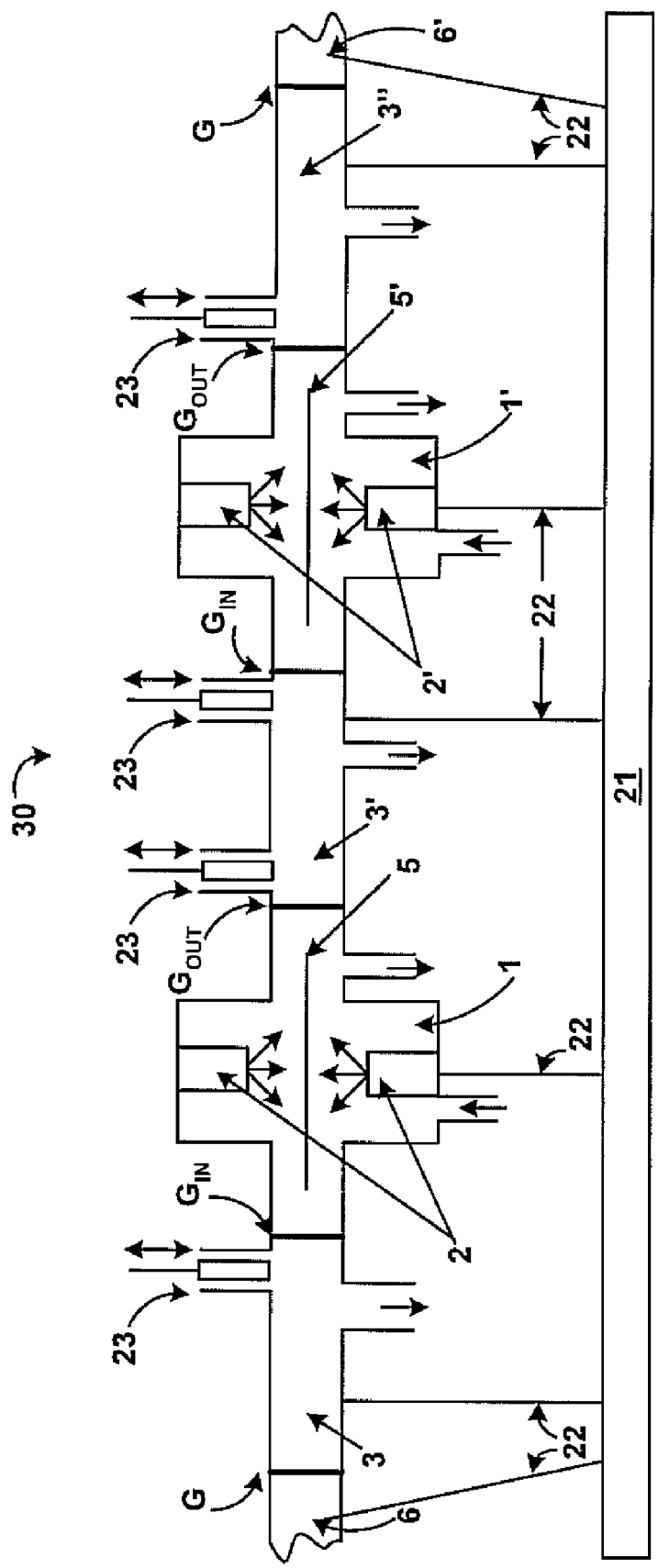
FIG. 4 is a simplified, schematic cross-sectional top view of a portion of a multi-chamber, in-line processing/treatment apparatus according to another embodiment of the present invention.

Referring to FIGS. 3-4, shown therein are simplified, schematic cross-sectional top views of portions of multi-chamber, in-line processing/treatment apparatuses 20 and 30 according to embodiments of the present invention. As illustrated, apparatuses 20 and 30 each have an in-line arrangement similar to apparatus 10 shown in FIGS. 1-2, but wherein gas inlet and outlet means for supplying and withdrawing process gas(es) from the various process/treatment stations or chambers 1, 1', etc. and buffer/isolation chambers 3, 3', 3" are explicitly shown. Apparatuses 20 and 30 according to the invention differ in fundamental respect from conventional apparatus 10 in the provision of means 21, e.g., a programmed computer means, operationally connected thereto, as by a plurality of electrical lines 22, for controlling/regulating the operation and sequencing of each of the processing/treatment (e.g., sputtering) stations or chambers 1, 1', etc., their associated inlet and outlet gate means $G_{in}$ and $G_{out}$, gas inlet flow and pump-out, and transport of substrates/workpieces 4, 4', etc. carried by pallets 5, 5' serially through the various stations/chambers of apparatuses 20 and 30. In addition, apparatus 30 is provided with a plurality of movable gas shields 23 adjacent the inlet and outlet gate means $G_{in}$ and $G_{out}$ of at least some of the treatment/processing stations or chambers (e.g., 1 and 1') for controllably regulating (e.g., decreasing) gas conductance between the treatment/processing stations or chambers and their respective adjacent inlet and outlet buffer/isolation chambers (e.g., 3, 3', and 3").

According to the invention, means 21 for controlling/regulating operation and sequencing of the various components of multi-chamber processing/treatment apparatuses 20 and 30 (e.g., programmable computer means) is programmed to provide the following operational sequence for substantially eliminating, or at least minimizing, the aforementioned problems, disadvantages, and drawbacks associated with conventional multi-chamber apparatus, e.g., product throughput rates limited by the intervals required for evacuating processes gas(es) from the various process/treatment stations or chambers upon removal of treated/processed substrates/workpieces and re-filling of the process/treatment stations or chambers with fresh process gas(es) for processing/treatment of substrates/workpieces supplied to the station or chamber from the adjacent (upstream) station or chamber:

(1) performing a respective treatment/processing (e.g., sputter deposition) of at least one substrate/workpiece 4, 4', etc. in each of the treatment/processing chambers 1, 1', etc., while each inlet gate $G_{in}$ and each outlet gate $G_{out}$ of each treatment/processing chamber is in a closed position and gas is exhausted from each buffer/isolation chamber 3, 3', 3", etc., and optionally exhausted (at a relatively lower rate) from each treatment/processing chamber;

(2) opening each of the inlet and outlet gates $G_{in}$ and $G_{out}$ of each of the treatment/processing chambers 1, 1', etc. and transporting the at least one substrate/workpiece 4, 4', etc. therein to the adjacent buffer/isolation chamber 3, 3', 3", etc.;

(3) closing the outlet gate $G_{out}$ of each of the treatment/processing chambers (as in apparatus 20) or reducing the gas conductance thereof (as in apparatus 30, via insertion of movable gas shield means 23) immediately after entry of the respective at least one substrate/workpiece into the adjacent buffer/isolation chamber during transport;

(4) transporting each of the substrates/workpieces through respective buffer/isolation chamber 3, 3', 3", etc. and initiating a flow of a respective process gas to each treatment/processing chamber 1, 1', etc.; and (5) closing the inlet gate $G_{in}$ of each treatment/processing chamber 1, 1', etc. immediately upon completion of entry of the at least one substrate/workpiece into the respective treatment/processing chamber.

Figure 5A:
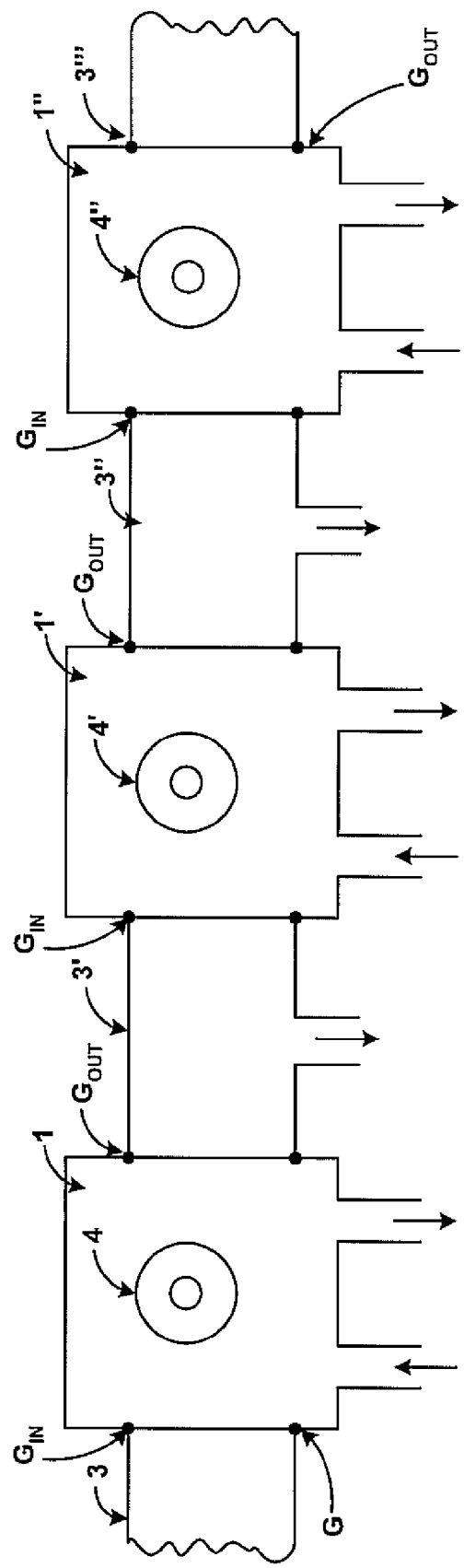
FIGS. 5 (A)-5 (B) schematically illustrate stages in the processing/treatment cycle of substrates/workpieces in multi-chamber apparatus according to the present invention.
Figure 5B:
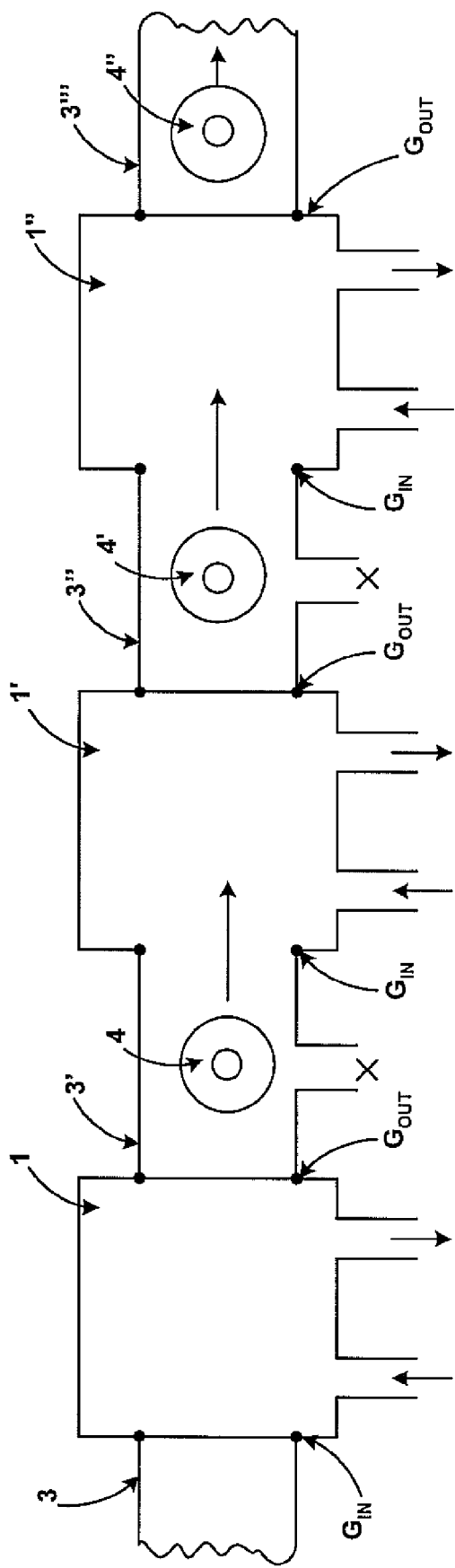

Referring now to FIGS. 5 (A)-5 (B) schematically illustrated therein are stages in the processing/treatment cycle of substrates/workpieces 4, 4', 4" (illustratively a single annular disk-shaped substrate for a magnetic or magneto-optical (MO) recording medium) in in-line multi-chamber apparatus according to the present invention, e.g., apparatuses 20 or 30, wherein:

FIG. 5 (A) illustrates the situation/configuration during treatment or processing of the substrates 4, 4', 4", e.g., sputter deposition, wherein each of the inlet and outlet gates $G_{in}$ and $G_{out}$ of each sputtering station or chamber 1, 1', 1" are in a closed position, sputter gas(es) are flowed into and pumped out from each sputtering station or chamber to maintain steady-state atmospheric conditions therein, and gas(es) are pumped out from each buffer/isolation chamber 3', 3".

FIG. 5 (B) illustrates the situation/configuration after completion of sputter deposition on each of the substrates/workpieces 4, 4', 4" and during transport of the substrates to the adjacent downstream sputtering station or chamber, when the substrates/workpieces have completely exited the respective upstream sputtering station or chamber and are being transported through the respective buffer/isolation chambers operationally connecting the upstream and downstream sputtering stations or chambers. As illustrated, according to the invention, during transport of the substrates/workpieces the outlet gate $G_{out}$ of the upstream sputtering station or chamber (apparatus 20) is closed or the movable gas shield of the upstream sputtering station or chamber (apparatus 30) is inserted to reduce the inter-chamber gas conductance, and the inlet gate $G_{in}$ of the downstream sputtering station or chamber opened while sputtering gas is flowed into the downstream sputtering station or chamber.

According to either embodiment of the invention, flow of gas to the downstream sputtering station or chamber is initiated after the outlet gate $G_{out}$ of the upstream sputtering station or chamber is closed (or a gas shield inserted thereat) but prior to completion of transport of the substrate/workpiece to the downstream sputtering station or chamber and closing of the inlet gate $G_{in}$ of the downstream sputtering station or chamber. As a consequence, respective sputtering gas(es) readily fill(s) the sputtering stations or chambers prior to completion of the substrate/workpiece transport process. The inlet gates $G_{in}$ of the downstream sputtering stations or chambers close when the substrates/workpieces completely enter the respective station or chamber. Pump-out of the downstream stations or chambers can commence during sputter deposition therein.

The inventive methodology and apparatus provide increased product throughput rates vis-à-vis the conventional methodology and apparatus and enjoy particular utility in the manufacture of multi-layer, thin-film magnetic and/or MO recording media, e.g., in disk form. Further, the inventive methodology and apparatus are fully compatible with all aspects of automated magnetic and Mo media manufacture, and the invention is broadly applicable to the manufacture of a variety of different products, e.g., coated architectural glass and optical coatings.

In the previous description, numerous specific details are set forth, such as specific materials, structures, processes, etc., in order to provide a better understanding of the present invention. However, the present invention can be practiced without resorting to the details specifically set forth. In other instances, well-known processing materials, structures, and techniques have not been described in detail in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. A method of treating/processing magnetic and/or magneto-optical disks in a multi-chamber treatment/processing apparatus, comprising:

providing a multi-chamber treatment/processing apparatus adapted for sputter deposition of a plurality of stacked layers forming part of a magnetic or magneto-optical recording medium on each of at least one magnetic and/or magneto-optical disk, comprising at least a pair of operatively interconnected upstream and downstream treatment/processing chambers;

providing each of said upstream and downstream treatment/processing chambers with at least one magnetic and/or magneto-optical disk;

treating/processing said at least one magnetic and/or magneto-optical disk positioned in each of said upstream and downstream treatment/processing chambers;

evacuating process gas from each of said upstream and downstream treatment/processing chambers during or upon completion of said treating/processing of said at least one magnetic and/or magneto-optical disk positioned therein;

removing said at least one magnetic and/or magneto-optical disk from said downstream treatment/processing chamber and initiating transport of said at least one magnetic and/or magneto-optical disk from said upstream treatment/processing chamber to said downstream treatment/processing chamber; and initiating a flow of said process gas to the evacuated downstream treatment/processing chamber prior to completion of said transport.

2. A method of treating/processing magnetic and/or magneto-optical disks in a multi-chamber treatment/processing apparatus, comprising:

providing a multi-chamber treatment/processing apparatus comprising at least a pair of operatively interconnected upstream and downstream treatment/processing chambers;

providing each of said upstream and downstream treatment/processing chambers with at least one magnetic and/or magneto-optical disk;

treating/processing said at least one magnetic and/or magneto-optical disk positioned in each of said upstream and downstream treatment/processing chambers;

evacuating process gas from each of said upstream and downstream treatment/processing chambers during or upon completion of said treating/processing of said at least one magnetic and/or magneto-optical disk positioned therein;

removing said at least one magnetic and/or magneto-optical disk from said downstream treatment/processing chamber and initiating transport of said at least one magnetic and/or magneto-optical disk from said upstream treatment/processing chamber to said downstream treatment/processing chamber; and initiating a flow of said process gas to the evacuated downstream treatment/processing chamber during said transport.

3. The method according to claim 2, comprising:
initiating said flow of process gas to said downstream treatment/processing chamber when said at least one magnetic and/or magneto-optical disk has completely exited said upstream treatment/processing chamber and is in a buffer/isolation chamber operatively connecting said upstream and downstream treatment/processing chambers.

4. The method according to claim 3, comprising:
opening an inlet gate of said downstream treatment/processing chamber and closing an outlet gate of said upstream treatment/processing chamber upon exiting of said at least one magnetic and/or magneto-optical disk from said upstream treatment/processing chamber.

5. The method according to claim 3, further comprising:
opening an inlet gate of said downstream treatment/processing chamber and reducing the gas conductance of an outlet gate of said upstream treatment/processing chamber upon exiting of said at least one magnetic and/or magneto-optical disk from said upstream treatment/processing chamber.

6. The method according to claim 5, comprising:
reducing said gas conductance of said outlet gate of said upstream treatment/processing chamber by means of a movable shield placed adjacent said outlet gate of said upstream treatment/processing chamber.

7. The method according to claim 1, comprising:
providing a multi-chamber treatment/processing apparatus wherein at least each of said pair of upstream and downstream treatment/processing chambers is adapted to perform a physical vapor deposition (PVD) process selected from the group consisting of vacuum evaporation, sputtering, ion plating, ion beam deposition (IBD), and cathodic arc deposition (CAD), a chemical vapor deposition (CVD) process, or a plasma process selected from the group consisting of plasma-enhanced chemical vapor deposition (PECVD), plasma treatment, plasma etching, reactive plasma etching, and implantation.

8. The method according to claim 7, comprising:
providing a multi-chamber treatment/processing apparatus wherein at least said downstream treatment/processing chamber is adapted to perform sputter deposition of a layer of a preselected material on at least one surface of said at least one magnetic and/or magneto-optical disk, and said process gas comprises a preselected sputtering gas.

9. The method according to claim 1, comprising:
providing a multi-chamber treatment/processing apparatus adapted for deposition of a plurality of stacked layers on each of said magnetic and/or magneto-optical disks.

\* \* \* \* \*